United States Patent [19]
Yasuda et al.

[11] 3,970,894
[45] July 20, 1976

[54] DEFLECTION SYSTEM

[75] Inventors: Tooru Yasuda, Yao; Yoshinori Kitamura, Katano; Ryuhei Nakabe, Hirakata, all of Japan

[73] Assignee: Matsushita Electric Industrial Co., Ltd., Osaka, Japan

[22] Filed: Sept. 3, 1974

[21] Appl. No.: 502,796

[30] Foreign Application Priority Data
  Sept. 3, 1973  Japan.............................. 48-99018
  Sept. 3, 1973  Japan.............................. 48-99019
  Sept. 3, 1973  Japan.............................. 48-99020
  Nov. 19, 1973  Japan............................. 48-131073

[52] U.S. Cl............................ 315/370; 315/387; 315/395; 315/399
[51] Int. Cl.² ...................................... H01J 29/70
[58] Field of Search............ 315/399, 408, 387–390, 315/404, 406, 370, 395

[56] References Cited
UNITED STATES PATENTS
3,689,797  9/1972  Hetterscheid...................... 315/403
3,848,155  11/1974  Titus et al............................ 315/370

Primary Examiner—Maynard R. Wilbur
Assistant Examiner—Richard E. Berger
Attorney, Agent, or Firm—Stevens, Davis, Miller & Mosher

[57] ABSTRACT

A deflection system for television cameras or the like. It is provided with a circuit for producing a reference sawtooth wave signal and means for comparing the reference sawtooth wave signal and sawtooth wave current flowing in the deflection coil, whereby the current flowing in the deflection yoke is controlled to give linearity and amplitude desired for the deflection by using a signal obtained from the comparison.

16 Claims, 26 Drawing Figures

F I G. 5
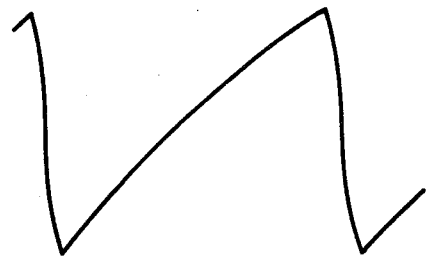

DEFLECTION SYSTEM

This invention relates to deflection systems, which permits deflection to be effected in response to the signal obtained through comparison of a reference sawtooth wave signal and sawtooth wave current flowing in the deflection coil.

In the accompanying drawings:

FIG. 5 shows the wave form of current flowing in the deflection coil in the circuit of FIG. 4;

Figure 1:
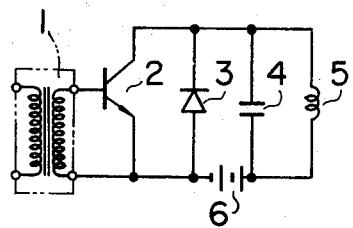
FIG. 1 is a circuit diagram of the basic circuit construction for effecting horizontal deflection on the basis of a switching action of a switching element.
Figure 2:
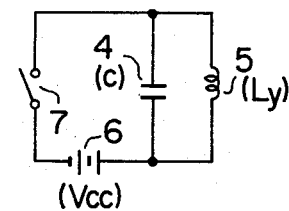
FIG. 2 is a circuit diagram showing an equivalent circuit of the construction of FIG. 1.
Figure 3:
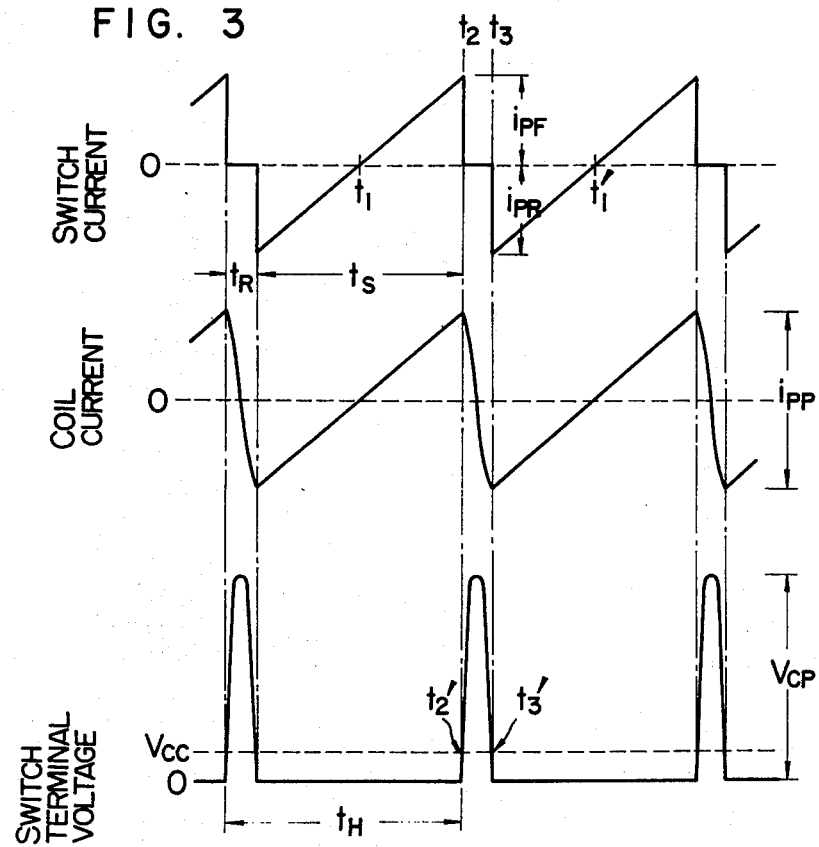
FIG. 3 is a waveform chart illustrating the operation of the circuit of FIG. 2.

The horizontal deflection circuit of the switching type has a basic circuit construction as shown in FIG. 1. FIG. 2 shows its equivalent circuit, and FIG. 3 shows voltage and current waves appearing in the operation of the equivalent circuit.

The circuit of FIG. 1 comprises a horizontal driving transformer 1, a horizontal output transistor 2, a damping diode 3, a resonance capacitor 4, a deflection coil 5, and a power supply 6. In FIG. 2, numeral 7 designates a switch.

The operation of this deflection circuit will now be discussed with reference to FIGS. 2 and 3. When the switch 7 is closed, a current flows through the deflection coil 5. This circuit increases linearly from zero from the instant $t_1$ of closure of the switch. When the switch 7 is opened at instant $t_2$, the switch current is immediately reduced to zero. However, since energy is stored in the coil 5 at this time, there occurs an oscillation in the resonant circuit of coil 5 and capacitor 4, and the coil current intersects the zero axis one-fourth cycle of the oscillation after the instant $t_2$. At this moment, the terminal voltage across the switch has a peak value, and thereafter the coil current increases in the reverse direction, reaching the reverse maximum value at instant $t_3$ one-half cycle of the oscillation after the instant $t_2$. At the instant $t_3$, the terminal voltage across the switch is lowered to $V_{cc}$, and thereafter it is further lowered and tends to intersect the zero voltage level at an instant $t_3'$. With closing of the switch 7 at this instant, however, the oscillation is stopped, and thereafter the switch voltage remains constant at zero. The switch current, which is also at the reverse maximum value at the instant $t_3$, rises linearly from that instant and becomes zero and turns to increase in the forward direction at instant $t_1'$. With the repetition of the above sequence a sawtooth wave as is illustrated is obtained. The flyback period here is thus one-half cycle of the oscillation, and a half-cycle sinusoidal voltage appears across the switch 7 during its cut-off period (i.e., flyback period).

Here, the forward peak value of the switch current is given as $$i_{PF} = V_{cc}/(2Ly)ts \qquad (1)$$

the peak value of the switch voltage as $$V_{cp} = 2\pi f_r L y i_{PF} + V_{cc} \qquad (2)$$

where $$f_r = \frac{1}{2\pi \sqrt{LyC}}$$

the reverse peak value of the switch current as $$i_{PR} \approx i_{PF} \qquad (3)$$

the coil current as $$i_{PP} = i_{PF} + i_{PR} = 2i_{PF} \qquad (4)$$

the flyback period as $$t_R = \frac{1}{2} f_r \qquad (5)$$

the trace period as $$t_s = t_H - t_R \qquad (6)$$

where $t_H$ is the horizontal deflection period.

Hence, we can express the coil current as $$i_{PP} = 2i_{PF} = V_{cc}/Ly \cdot t_s \qquad (7)$$

Figure 4:
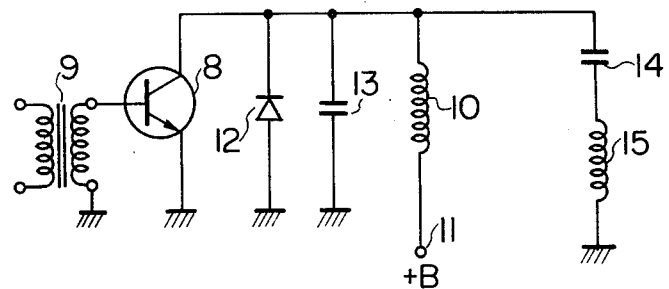
FIG. 4 is a circuit diagram showing an example of the prior art horizontal deflection circuit of the switching type.

FIG. 4 shows an example of the prior art horizontal deflection circuit. Designated at 8 in the Figure is a horizontal output transistor, to the base of which an end of the secondary winding of a drive transformer 9 is connected to supply the horizontal drive pulse signal to it. The transistor 8 has its emitter connected to ground and its collector connected to an end of an inductor 10, the other end of inductor 10 being connected to a +B supply. A damping diode 12 and a resonance capacitor 13 are connected in parallel between the collector and ground. A series circuit consisting of a d-c blocking capacitor 14 and a deflection coil 15 is also connected between the collector and ground. With this construction, there flows in the deflection coil 15 a deflection current as shown in FIG. 5, having a non-linear wave-form rising exponentially. Since the deflection coil current in the prior art transistorized deflection circuit of this type has the wave-form rising exponentially in the trace period due to the resistance in the circuit, good linearity cannot be obtained. The distortion $d$ of deflection here is given as $$d = \frac{1}{2} t_s (R_y + r_s)/L_s \qquad (8)$$

where $t_s$ is the trace period, $R_y$ is the resistance of the deflection yoke, and $r_s$ is the saturation resistance of the transistor (inclusive of the internal resistance of the diode). It will be seen from this equation that in the circuit where the horizontal deflection coil is driven by means of switching action of a transistor the linearity is determined by the total resistance of the circuit. Accordingly, the saturation resistance of the switching transistor, d-c resistance of the horizontal deflection coil and internal resistance of the damping diode should be made as small as possible to the end of improving the linearity of the sawtooth wave current flowing in the deflection coil for minimizing the distortion of deflection.

It will also be seen from equation (7) that the amplitude of the coil current is greatly affected by variations of the source voltage $V_{cc}$. Accordingly, it has been the practice to minimize the d-c resistance by increasing the line diameter of the horizontal deflection coil or reducing the turns number thereof. However, the reduction of the turns number is restricted by the ratio between inductance L and resistance R. As another measure, it has been contemplated to reduce the saturation resistance of the switching transistor by increasing the size thereof. However, doing so will lead to high cost, and also with this measure alone sufficient improvement of the linearity cannot be obtained. At any rate, the above measures dictate increased size of the horizontal deflection coil and switching transistor. As a further measure, it has been proposed to connect the damping diode to an output transformer stepping up the collector voltage on the horizontal output transistor, thereby equivalently reducing the internal resistance of the diode. This method, however, leads to slight reduction of the deflection current and increased loss, so that it is difficult to obtain perfect conpensation. As a further proposed method, the change of flux in the deflection coil is compensated with secondary current flowing in a secondary resonant circuit loosely coupled to the coil. This system permits not the compensation of the coil current but direct compensation of the change of flux acting upon the electron beam passing through the deflection coil, but it is expensive and has a very complicated construction. As a still further method, it has been proposed to connect linearity coil in series with the horizontal deflection coil for improving the linearity. With the linearity coil inserted, the self-inductance is varied with the deflection current. However, the deflection current is greatly reduced to increase the loss, and also the reliability is insufficient for the linearity and amplitude are subject to changes with ambient temperature and also with use.

In another prior art deflection circuit, a compensating transistor is inserted in the power circuit for the switching transistor, and a d-c voltage adjusting element and an a-c signal source supplying a desired signal voltage are connected to the base of the compensating transistor. In this circuit, the basis voltage on the compensating transistor is adjusted through the d-c voltage adjusting element to desirably adjust the amplitude of the sawtooth wave, while removing the distortion of the sawtooth wave by superimposing a compensating signal of the desired wave-form from the a-c signal source upon the bias voltage on the base of the compensating transistor. This circuit is disclosed in Japanese Patent Publication No. 5257/1964 and is shown in FIG. 6.

Figure 6:
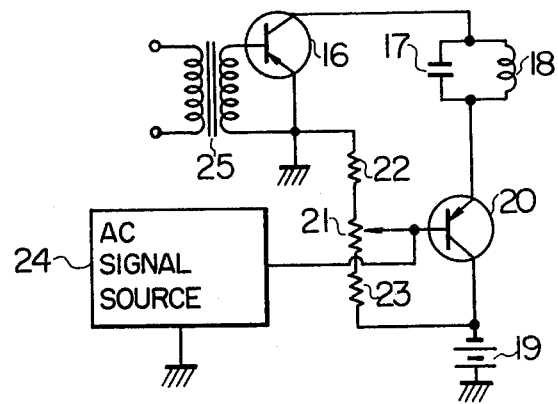
FIG. 6 shows another example of the prior art horizontal deflection circuit.

In FIG. 6, designated at 16 is the switching transistor, and a capacitor 17 and a coil 18 constitute an output side resonant circuit. Designated at 19 is the power supply, and at 20 the compensating transistor connected between the output side resonant circuit and power supply 19. A variable resistor 21 and resistors 22 and 23 constitute the ampltitude adjuster connected to the base of the compensating transistor 20. Designated at 24 is the a-c signal source for supplying an output of the desired wave-form to the base of the transistor 20, and at 25 a driving transformer for driving the switching transistor 16.

Figure 7:
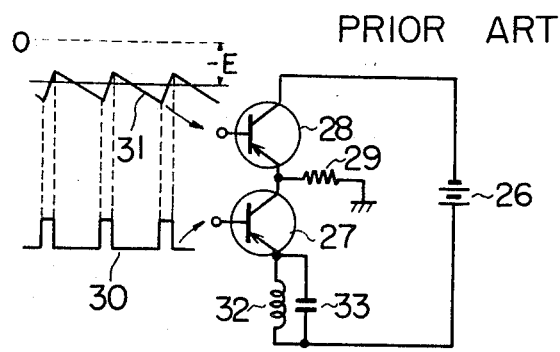
FIG. 7 shows a further example of the horizontal deflection circuit.

In still another prior art deflection circuit, a series circuit of a switching transistor and deflection coil is connected as a load of an emitter follower, and a sawtooth wave signal equal to the voltage drop across the circuit resistance inclusive of the resistance of the deflection coil is superimposed upon a fixed base bias voltage on the emitter follower, thereby to obtain the compensation of linearity. This circuit is disclosed in Japanese Patent Publication No. 5286/1966 and is shown in FIG. 7.

In the Figure, connected between power supply 26 and switching transistor 27 is a voltage compensating transistor 28 constituting the emitter follower together with a load resistor 29. Here, a sawtooth wave voltage indicated at 31 is superimposed upon a d-c drive pulse voltage 30 corresponding to the trace period to the base of the switching transistor 27, whereby the output voltage of the emitter follower transistor is adjusted to compensate the amplitude and linearity of the deflection current flowing in an output resonant circuit of a coil 32 and a capacitor 33.

While there have been proposed various compensating methods as mentioned above, they all concern compensation in the output stage; that is, all the above prior art examples permit mere static compensation without provision of any feedback compensation circuit, in which the deflection current actually flowing in the deflection coil is detected for effecting the compensation of the linearity and amplitude in accordance with the detected deflection current.

In other words, although the prior art circuits have a compensating means for compensating the linearity and amplitude of the deflection current, the compensation signal entering the compensating circuit is not produced on the basis of detection of the current actually flowing in the deflection coil but is produced on the basis of mere superimposition of a desired signal having a sawtooth or other wave-form and a d-c voltage. Therefore, dynamic compensation of the linearity and amplitude of the deflection current are effected with respect to variations due to external factors such as variations of ambient temperature, variations of circuit parameters in use and fluctuations of the source voltage.

As a further prior art example, Japanese Patent Publication No. 24976/1971 discloses a system, in which the linearity and amplitude of the deflection current is automatically compensated. In this system, a scene image on a photo-electric picture tube screen is disassembled into stripes to produce from the individual stripe a color disassembled image color disassembled in the direction of arrangement of the stripes, the color disassembled image is then superimposed upon a lattice image having bright and dark elements arranged at a constant interval in the direction of arrangement of the above stripes, the color disassembled image and lattice image are then scanned with an electron beam such that the direction of the horizontal scanning crosses the strips and lattices, an control signal corresponding to the afore-said lattice image is separated from the video signal based on the scanning electron beam and supplied to a frequency discriminator, and the output of the frequency discriminator is supplied to the horizontal deflection circuit of the picture tube to control the horizontal deflection current such that the frequency of the control signal is constant. Here, the horizontal deflection current is controlled with a control signal obtained through the detection of variations of the linearity and amplitude of the deflection current in the horizontal deflection coil in the frequency discriminator by using an index signal contained in the video signal.

This system has a drawback in that when the video signal is lost (such as when the illumination of the scene is greatly reduced or when a black scene is scanned), the index signal is also lost, disabling to take out the control signal from the frequency discriminator. Therefore, means for ensuring the index signal such as by illumination with bias light has to be provided. However, illumination with bias light inevitably results in deterioration of the picture quality and interduces complications in the construction and high cost.

An object of this invention is to provide a horizontal deflection circuit, having improved linearity and which ensures stable amplitude of the horizontal deflection current flowing in the horizontal deflection coil, and with which variations of the wave form of the horizontal deflection current due to external factors can be automatically compensated for.

Figure 8:
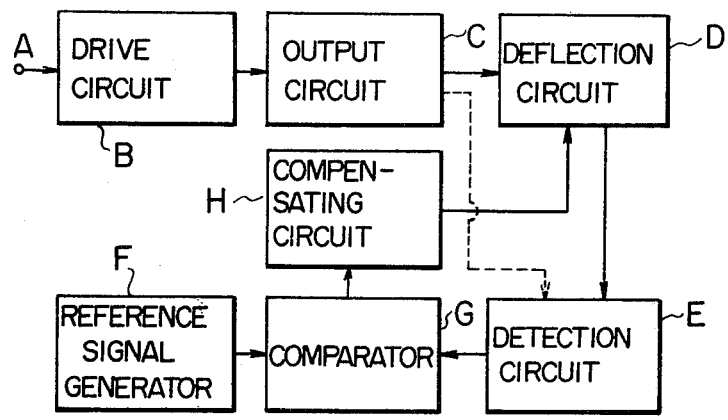
FIG. 8 is a block diagram outlining the basic construction of the horizontal deflection circuit according to the invention.

The horizontal deflection circuit according to the invention has a basic construction as shown in the block diagram of FIG. 8. Indicated at A in the Figure is an input terminal, to which a pulse signal synchronized to the horizontal scanning frequency is added to cause switching action of a drive circuit B including a driving transistor. The drive circuit B produces a pulse signal for driving an output circuit C including an output transistor, and the output circuit C operates a deflection circuit D including a deflection coil and a deflection control for producing the deflection current in the deflection coil. In accordance with the invention, there are provided a detection circuit E, which is responsive to the horizontal deflection current flowing in the deflection coil and produces a detection signal having a sawtooth wave-form analogous to that of the deflection current, and a reference signal generator F, which produces a reference signal having a desired wave-form required for the horizontal deflection current in the deflection coil. Both the afore-said detection signal and reference signal are fed to a comparator G for comparison to produce a comparison output signal, which is coupled to a compensating circuit H for obtaining a control signal having the desired sawtooth wave-form and amplitude, the control signal being added to a control means in the deflection circuit D for controlling the horizontal deflection current desired wave form. In this way, by setting a desired wave-form for the horizontal deflection current automatic compensation of the deflection current wave may be obtained through feedback. Where the amplitude of the horizontal deflection current, once set to a certain value, is not affected by external factors such as supply voltage fluctuations and temperature changes, the comparison output signal may also be accurately and readily obtained by an arrangement which produces the reference signal from the sync. signal or the like and setting and fixing the reference signal amplitude to the detection signal amplitude level. Also, the comparison output signal may be accurately and readily obtained by an arrangement wherein the two inputs to the comparator, i.e., the detection signal having the sawtooth wave form analogous to that of the deflection current and the reference signal produced from the reference signal generator, undergo an amplitude change at a constant ratio when the amplitude of the deflection current is varied by means of an amplitude adjuster provided in the deflection circuit or output circuit or due to external factors such as source voltage fluctuations and temperature changes.

Figure 9:
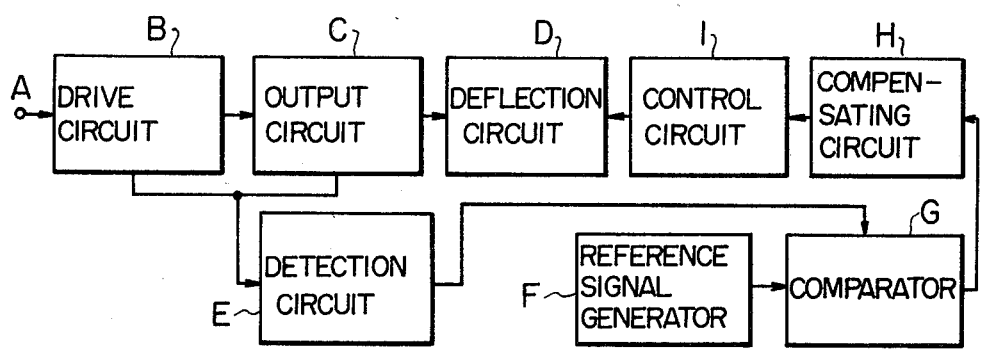
FIG. 9 is a block diagram outlining an embodiment of the horizontal deflection circuit according to the invention.

FIG. 9 shows a block diagram of an embodiment of the horizontal deflection circuit according to the invention. Here, a pluse input synchronized to the horizontal scanning frequency is added to an input terminal A for operating a drive circuit B including a horizontal driving transistor. The drive pulse signal obtained from the drive circuit B is used to drive a horizontal output circuit C, and the output thereof is used to operate a horizontal deflection circuit D including a deflection coil, thus causing the horizontal deflection current to flow in the deflection coil. In this embodiment, a detection circuit E responsive to the outputs of the circuits B and C produces a signal substantially equal to the horizontal deflection current, while a reference signal having a desired sawtooth wave-form is produced by a reference signal generation F. These reference and detection signals are compared by a comparator G to produce a comparison output, according to which a controlled signal generator H produces a controlled signal having the desired sawtooth wave-form and amplitude. The controlled signal is coupled to a control circuit I, which produces a control signal supplied to the horizontal deflection circuit D, thereby obtaining a deflection current having the desired linearity.

Figure 10:
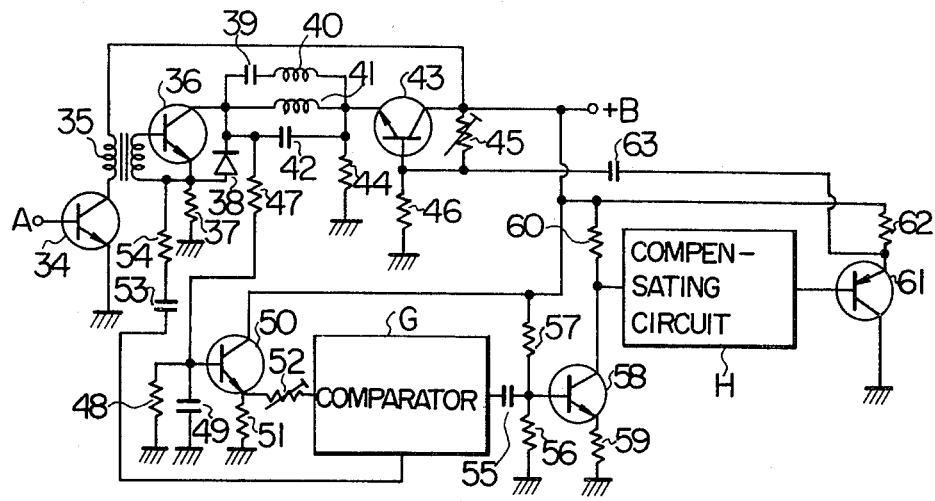
FIG. 10 is a circuit diagram showing an example of the horizontal deflection circuit according to the invention.

FIG. 10 shows an example of the circuit construction of the horizontal deflection circuit according to the invention. In the Figure, a pluse input terminal A is connected to the base of a driving transistor 34, which has its emitter connected to ground and its collector connected to one end of the primary winding of a driving transformer 35, the other end of the primary winding being connected to a+B supply. The secondary winding of the driving transformer 35 is connected at one end to the base of a horizontal output transistor 36 and at the other end to the emitter of this transistor. The emitter of this transistor is also connected through a detection resistor 37 to ground, and a damping diode 38 is connected between the emitter and collector of this transistor. The collector of this transistor is also connected through a series circuit consisting of a d-c blocking capacitor 39 and a horizontal deflection coil 40 to the emitter of a control transistor 43. The aforesaid series circuit is connected in parallel with an inductor 41 and a resonant capacitor 42. The transistor has its emitter also connected through a resistor 44 to ground and its collector connected to the +B supply. Designated at 45 and 46 are bias resistors, the resistor 45 being a variable resistor serving as an amplitude adjuster. Resistors 47 and 48 constitute a voltage divider, and the resistor 48 also serves as a discharging resistance for an integrating capacitor 49 and bias resistor for a collector-grounded transistor 50, which has its emitter connected through a resistor 51 to ground and its collector connected to the +B supply. The emitter of the transistor 50 is also connected through a variable resistor 52 to a comparator G, while the emitter of the transistor 36 is also connected through a coupling capacitor 53 and a resistor 54 to the comparator G. The output signal of the comparator G is coupled through a coupling capacitor 55 to the base of an amplifying transistor 58 biased through resistors 56 and 57. The transistor 58 has its emitter connected through a resistor 59 to ground and its collector connected through a resistor 60 to the +B supply. The collector of the transistor 58 is also connected through a wave-form compensation circuit H to the base of a transistor 61, which has its emitter connected through a resistor 62 to the +B supply and through a coupling capacitor 63 to the base of the transistor 43.

In operation, in response to the pulse input appearing at the input terminal A in synchronism with the horizontal scanning frequency, the driving transistor 34 executes its switching action to cause a drive pulse signal to be produced on the secondary side of the driving transformer 35, thus driving the horizontal output transistor 36, to which the +B supply goes through the control transistor 43 and inductor 41. Since the d-c blocking capacitor 39 and deflection coil 40 are connected to the power supply side of the transistor 36, a sawtooth wave analogous to that of the deflection coil current can be obtained in the detection resistor 37. By varying the supply voltage from the +B supply through the control transistor 43 biased through the bias resistors 45 and 46, the collector pulse voltage on the output transistor 46 and the sawtooth voltage detected across the detection resistor 37 are varied at the same rate. The pulse signal appearing at the collector of the output transistor 36 is integrated through the resistors 47 and 48 and capacitor 49 to produce the desired reference sawtooth wave coupled through the collector-grounded transistor 50 and variable resistor 52 to the comparator G. Meanwhile, the detection signal having a non-linear sawtooth waveform analogous to that of the deflection coil current is coupled from the detection resistor 37 through the capacitor 53 and resistor 54 to the comparator G for comparison with the reference signal. At this time, the amplitude of the reference signal input is adjusted by the variable resistor 52 substantially to the same level as the detection signal analogous to the deflection coil current. The comparator G receiving these two input signals produces a comparison output signal, which is amplified through the amplifying transistor 58 for coupling to the waveform compensation circuit H which may be a differentiating circuit to produce an output, which is coupled as a sawtooth wave control signal through the collector-grounded transistor 61 to the base of the control transistor 43 in superimposition upon the d-c bias voltage, thereby controlling the horizontal deflection current to the desired wave-form.

Figure 11:
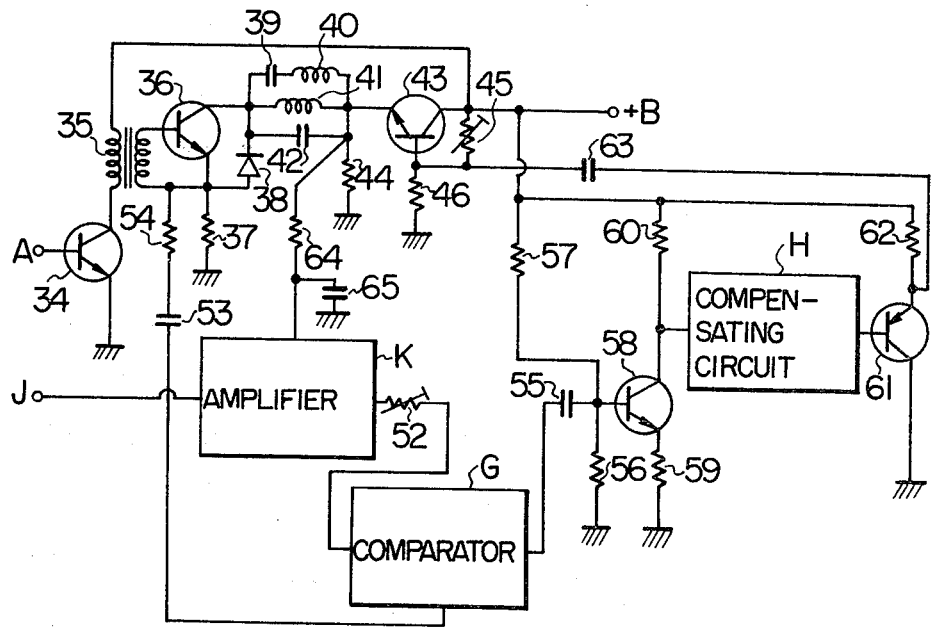
FIG. 11 is a circuit diagram showing another example of the horizontal deflection circuit according to the invention.

FIG. 11 shows another example of the horizontal deflection circuit according to the invention. Here, a desired sawtooth wave signal or pulse signal synchronized to the horizontal scanning frequency is added to an input terminal J. The bias on control transistor 43 is varied through variable resistor 45 (serving as an amplitude adjuster), and the sawtooth wave is amplified in an amplifier K in proportion to the emitter d-c voltage on the transistor 43; i.e., the amplitude of the horizontal deflection current. The resultant output is used as a reference signal for comparison with a detection signal analogous to the horizontal deflection current obtained from detection resistor 37 to obtain a comparison output signal, which is used for automatically controlling the horizontal deflection current to the desired wave form in the manner described in connection with the circuit of FIG. 10. In FIG. 11, similar parts to those in FIG. 10 are designated by like reference symbols.

Figure 12:
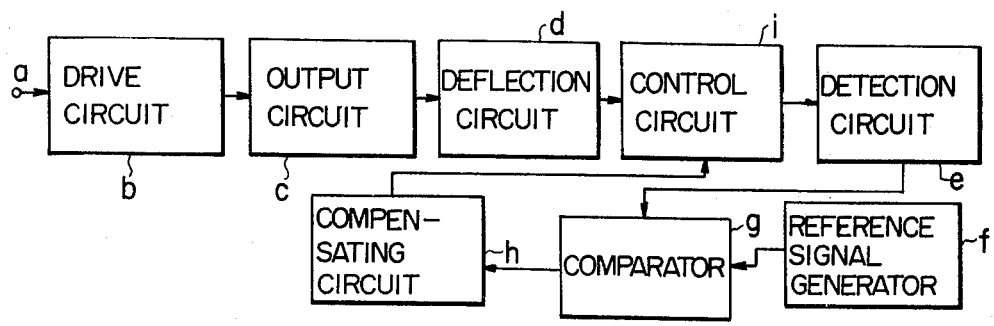
FIG. 12 is a block diagram of a further embodiment of the invention.

FIG. 12 shows a block diagram of another embodiment of the horizontal deflection circuit according to the invention. Here, a pluse input synchronized to the horizontal scanning frequency is added to an input terminal $a$ for operating a drive circuit $b$ including a horizontal driving transistor. The drive pulse signal obtained from the drive circuit $b$ is used to drive a horizontal output circuit $c$, whose output is coupled through a series system consisting of a horizontal deflection circuit $d$ including a deflection coil, a control circuit $i$ and a detection circuit $e$, thus causing the horizontal deflection current. The detection circuit produces a detection signal in accordance with the deflection current, while a reference signal generator $f$ produces a reference signal of a desired sawtooth wave form. Both the detection signal and reference signal are coupled to a comparator $g$ comparison to produce a comparison output signal, which is coupled to a waveform compensating circuit $h$ for compensation to the required sawtooth wave-form and amplitude. The output of the compensating circuit $h$ is coupled as a control signal to a control circuit $i$ for automatically controlling the wave form of the deflection current flowing in the deflection coil in the horizontal deflection circuit $d$. In this system, the amplitude of the reference signal from the reference signal generator $f$ and that of the detection signal from the detection circuit $e$ are made to vary at the same rate with the variation of the horizontal deflection current amplitude.

Figure 13:
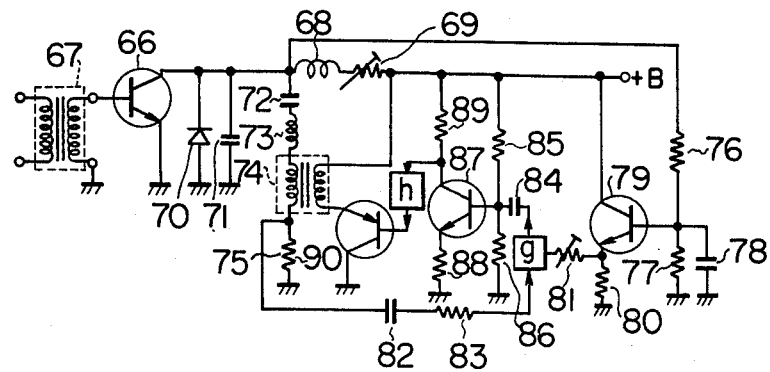
FIG. 13 is a circuit diagram showing an example of the horizontal deflection circuit based on the construction of FIG. 12.

FIG. 13 shows an example of the horizontal deflection circuit based on the construction of FIG. 12. Here, a horizontal drive pulse signal is coupled to the base of a horizontal output transistor 66 from and end of the secondary winding of a driving transformer 67, the other end of the secondary winding being connected to ground. The transistor 66 has its emitter connected to ground and its collector connected through a series circuit consisting of an inductor 68 and an amplitude adjuster 69 to a +B supply. A damping diode 70 and a resonance capacitor 71 are connected in parallel between the collector and emitter of this transistor. The collector is also connected through a series circuit consisting of a d-c blocking capacitor 72, a deflection coil 73, the secondary of a control transformer 74 and a detection resistor 75 to ground. Resistors 76 and 77 constitute a voltage divider, and the resistor 77 also serves as the discharging resistance for an integrating capacitor 78 and bias resistor for a collector-grounded transistor 79, which has its emitter connected through a resistor 80 to ground and its collector connected to the +B supply. The emitter of the transistor 79 is also connected through a variable resistor 81 to a comparator $g$, while the detection resistor 75 is connected through a coupling capacitor 82 and a resistor 83 to the comparator $g$. The output of the comparator is coupled through a coupling capacitor 84 to the base of an amplifying transistor 87 biased through bias resistors 85 and 86. The transistor has its emitter connected through a resistor 88 to ground and its collector connected through a resistor 89 to the +B supply. The collector of the transistor 87 is also connected through a wave-form compensation circuit $h$ to the base of a control transistor, which has its collector connected to ground and its emitter connected to one end of the primary winding of the control transformer 74, the other end of the primary winding being connected to the +B supply.

In operation, the horizontal output transistor is driven by the driving transformer 67, and it operates with a d-c voltage supplied from the +B supply through the amplitude adjuster 69 inductor 68 to cause the horizontal deflection current to pass through the d-c blocking capacitor 72 and deflection coil 73. At the same time, part of the horizontal deflection current is detected as a detection signal in the detection resistor 75, which is connected to ground in series with the secondary of the control transformer 74. The output at the collector of the horizontal output transistor 66 is coupled through the resistors 76 and 77 and capacitor 78 to produce a reference signal coupled through the collector-grounded transistor 79 and variable resistor 81 to the comparator $g$. Meanwhile, the afore-said detection signal is coupled through the coupling capacitor 82 and resistor 83 to the comparator. At this time, the amplitude of the reference signal input to the comparator is adjusted substantially to the same level as the detection signal input. The comparator $g$ receiving these two inputs produces a comparison output signal, which is amplified through the amplifying transistor 87 for coupling to the wave-form compensation circuit $h$ which may be a differentiating circuit to produce an output, which is coupled as a sawtooth wave control signal through the collector-grounded transistor 90 to the primary side of the control transformer 74, thereby controlling the horizontal deflection current to a desired wave-form. In this case, it is so adjusted that the amplitude of the detection signal and that of the reference signal vary at the same rate when the amplitude of the horizontal deflection current is varied through the amplitude adjuster or due to external factors such as temperature changes or source voltage fluctuations.

Figure 14:
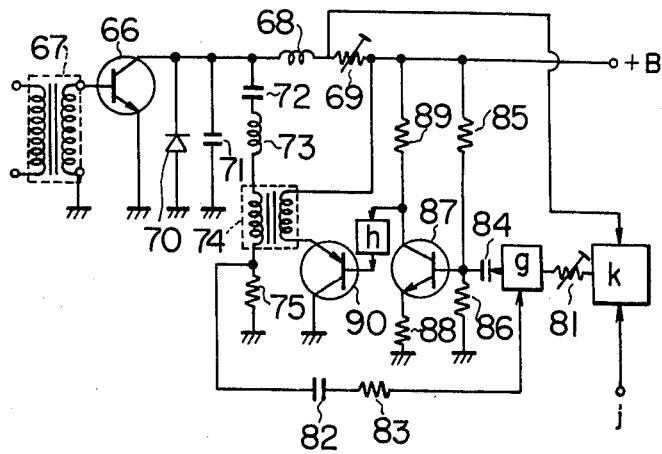
FIG. 14 is a circuit diagram showing a modification of the circuit of FIG. 13.

FIG. 14 shows a modification of the preceding circuit of FIG. 13. In FIG. 14, similar parts to those in FIG. 13 are designated by like reference symbols. Here, a desired sawtooth wave signal or pulse signal synchronized to the horizontal scanning frequency is added to an input terminal $j$. The sawtooth wave is amplified through an amplifier $k$ in proportion to the d-c voltage that may be varied through variable resistor 69 (serving as the amplitude adjuster) for varying the amplitude of the horizontal deflection current. The resultant output is used as a reference signal for comparison with a detection signal analogous to the horizontal deflection current obtained from detection resistor 75 to obtain a comparison output, which is used for automatically controlling the horizontal deflection current to the desired wave-form in the manner described in connection with the circuit of FIG. 13.

The wave-form compensation circuit H or $h$ shown in FIGS. 8 to 14 will now be discussed. The comparison output signal obtained through comparison of the reference sawtooth wave signal and detection signal has a parabolic wave-form, and it cannot be used as a control signal. The wave-form compensating circuit is provided for converting this signal into a sawtooth wave. Some conceivable methods for converting a parabolic signal into a sawtooth wave are as follows:

1. In one method, the parabolic wave of the comparison output signal is differentiated through a differentiating circuit to obtain a desired control signal.

Figure 15:
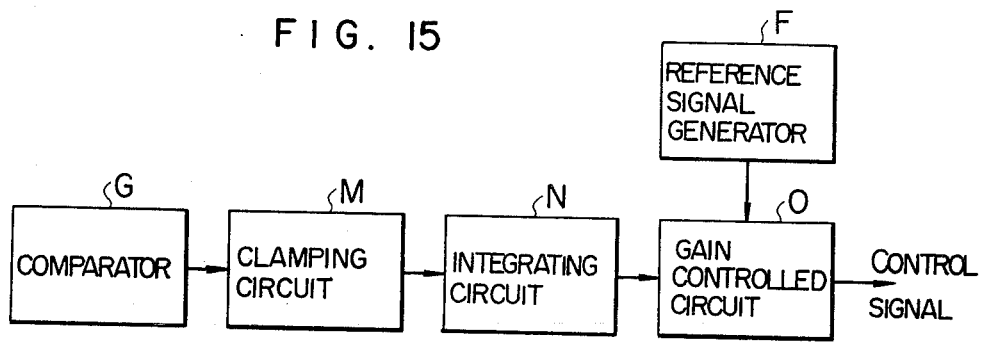
FIG. 15 is a block form representation of the wave-form compensating circuit.

2. In another method as shown in FIG. 15, the output signal of the comparator G is clamped in a clamping circuit M, whose output is coupled to an integrating circuit N to obtain a d-c output which is coupled to a gain controlled circuit O for controlling the amplitude of a compensating signal produced from a compensating signal generator F and similar to the control signal, thus obtaining the control signal.

Figure 16:
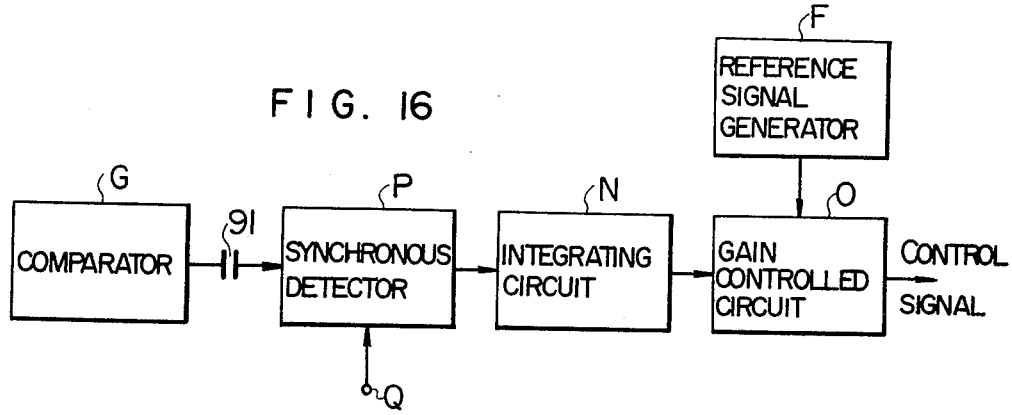
FIG. 16 is another block from representation of the wave-form compensating circuit.

3. In a further method as shown in FIG. 16, the output signal of the comparator G is smoothed through a capacitor 91 for synchronous detection with a synchronous detection signal Q in a synchronous detector P, whose output is coupled to an integrating circuit N to obtain a d-c output which is coupled to a gain controlled circuit O for controlling the amplitude of a compensating signal produced from a compensating signal generator F and similar to the control signal, thus obtaining the control signal.

Figure 17:
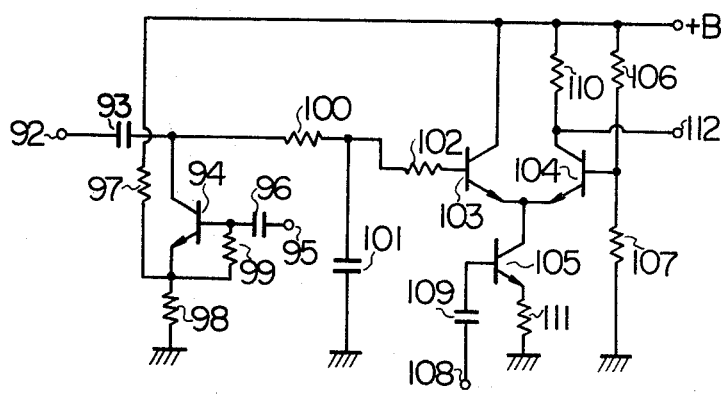
FIG. 17 is a circuit diagram showing an example of the wave-form compensating circuit.

FIG. 17 shows an example of the wave-form compensation circuit. The comparison output signal from the comparator is added to an input terminal 92 and coupled through a capacitor 93 to the collector of a clamping transistor 94. A clamping pulse signal for clamping for the blanking period is added to an input terminal 95 and coupled through a coupling capacitor 96 to the base of the transistor 94. The clamping level is appropriately set by connecting the emitter of the transistor 94 to resistors 97 and 98. A resistor 99 connected between the emitter and base serves as a bias resistor. With this clamping circuit the output signal of the comparator is clamped for detection of the polarity and level of the comparison output signal with respect to the clamping level. A resistor 100 and a capacitor 101 constitute an integrating circuit for integrating the output of the clamping circuit to obtain a d-c output, which is coupled through a resistor 102 to the base of a transistor 103 constituting together with transistors 104 and 105 a differential amplifier. The base of the transistor 104 is given a fixed bias through resistors 106 and 107. A compensating signal similar to the control signal and appearing at an input terminal 108 is coupled through a coupling capacitor 109 to the base of the transistor 105. The collector of the transistor 104 is connected through a load resistor 110 to the +B supply, and the emitter of the transistor 105 is connected through a resistor 111 to ground. As the polarity and level of the comparison output signal appearing at the input terminal 92 changes, the amplitude of a signal appearing across the load resistor 110; that is, the amplitude of the control signal appearing at an output terminal 112, changes.

Figure 18:
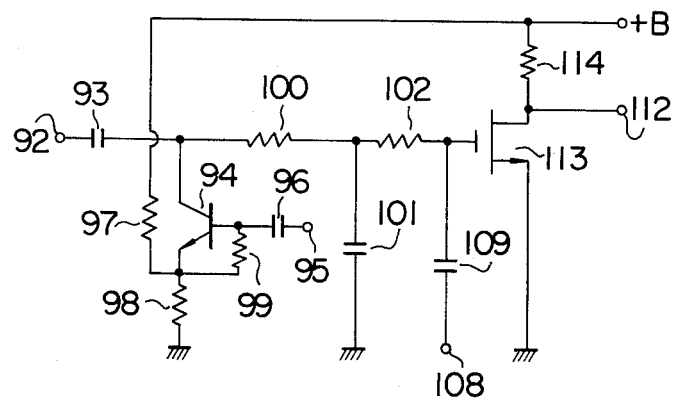
FIG. 18 is a circuit diagram showing another example of the wave-form compensating circuit.

FIG. 18 shows another example of the wave-form compensation circuit. In this example, a d-c voltage obtained by clamping the comparison output signal in a clamping circuit including a transistor 94 is coupled to the gate of a field-effect transistor 113, while a compensating signal similar to the control signal is simultaneously coupled from an input terminal 108 through a coupling capacitor 109. The field effect transistor 113 has its source connected to ground and its drain connected through a load resistor 114 to a +B supply. Thus, with a change in the d-c potential on the gate of the field-effect transistor 113 the $g_m$ thereof is varied to vary the amplitude of the control signal appearing at an output terminal 112 according to $g_m$ and $R_L$. In FIG. 18, similar parts to those in FIG. 17 are designated by like reference symbols.

Figure 19:
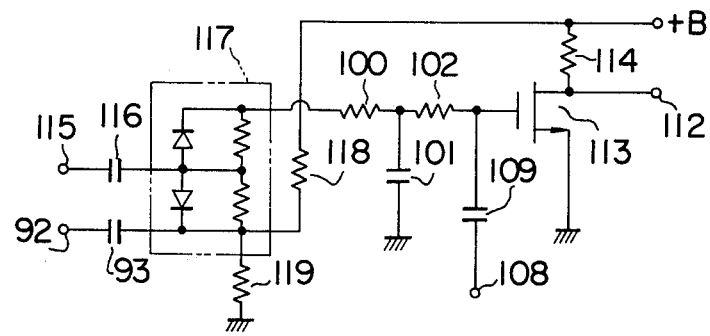
FIG. 19 is a circuit diagram showing a further example of the wave-form compensating circuit.
Figure 20:
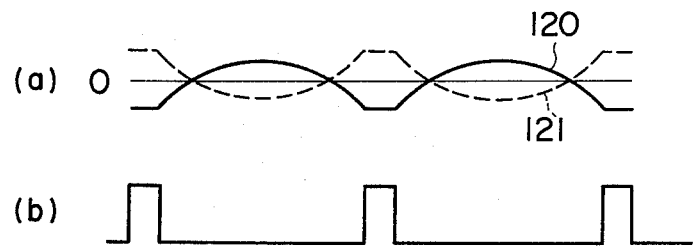
FIG. 20 is a wave-form representation of a comparison output signal and a synchronuous detection signal.

FIG. 19 is a further example of the wave-form compensation circuit. In this example, the comparison output signal added to an input terminal 92 is coupled through a coupling capacitor 93 to a synchronous detection circuit 117 biased through resistors 118 and 119 for synchronous detection with a synchronous detection signal coupled from an input terminal 116 through a coupling capacitor 115 to the detector 117, whose output is coupled to an integrating circuit consisting of a resistor 100 and a capacitor 101 to obtain a d-c output. This d-c signal is processed through a field-effect transistor 113 in the manner described in connection with the preceding example of FIG. 18. In this example, similar parts to those in the example of FIG. 18 are designated by like reference symbols and are not described here. By coupling the comparison output signal through the capacitor 93 either wave form 120 or 121 shown by a in FIG. 20 is obtained. Through synchronous detection of whichever one of the waves 120 and 121 other than the points of their intersection with the synchronous detection signal, for instance having a wave form as shown by b in FIG. 20, it is possible to determine the polarity with respect to the 0 level and also detect the level. Further, the control signal can be produced not only through the control of the amplitude of the compensating signal produced from the compensating signal generator and similar to the control signal but also through amplitude control using the signal from the reference sawtooth wave generator.

Figure 21:
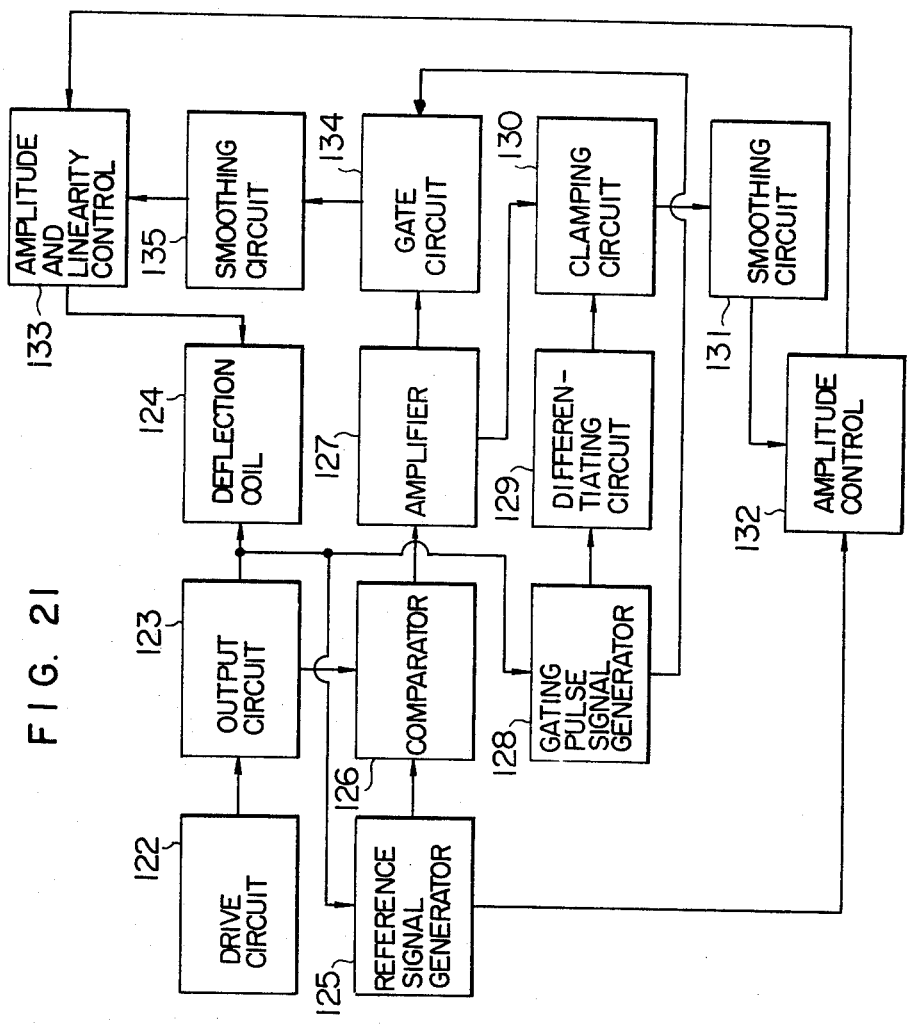
FIG. 21 is a block diagram showing a further embodiment of the invention.

FIG. 21 shows a further embodiment of the invention. In the Figure, designated at 122 is a drive circuit amplifying a horizontal drive signal, at 123 an output circuit, at 124 a horizontal deflection coil, at 125 a reference sawtooth wave signal generator, at 126 a comparator for comparing the two inputs, at 127 an amplifier for amplifying the output of the comparator 126, at 128 a circuit for producing a gating pulse signal, at 129 a differentiating circuit, at 130 a clamping circuit, at 131 a circuit for smoothing the clamped signal, at 132 an amplitude controller, at 133 a circuit for controlling the amplitude and linearity, at 134 a gate circuit, and at 135 a smoothing circuit.

In operation, the output circuit 123 is driven by the drive signal obtained from the drive circuit 122, whereby it causes deflection current to pass through the deflection coil 124. Meanwhile, a pulse output obtained from the output circuit 123 is coupled to the reference sawtooth wave signal generator 125 to produce a reference sawtooth wave signal, which is coupled to the comparator 126 for comparison with a detection signal obtained through the detection of the output of the output circuit 123 representing the deflection current flowing in the deflection coil 124, and the resultant comparison output signal is amplified through the amplifier 127. The pulse output of the output circuit 123 is also coupled to the gating pulse signal generator 128 to produce a gating pulse signal switching substantially at the center of the horizontal scanning period (1H), which pulse signal is differentiated in the differentiating circuit 129 to produce a pulse signal, which is in turn used to clamp the amplified signal from the amplifier 127 in the clamping circuit 130 substantially at the center of the horizontal scanning period. The clamped signal is smoothed through the smoothing circuit 131, and the smoothed signal is used to control the reference sawtooth wave signal to a desired amplitude in the amplitude controller 132. The resultant amplitude controlled sawtooth wave signal is coupled to the amplitude and linearity control circuit 133. Meanwhile, the amplified comparison output signal from the amplifier 127 is coupled to the gate circuit 134, and the gated signal gated with the gating signal from the gating pulse signal generator 128 is smoothed in the smoothing circuit 135, and the resultant smoothed signal is coupled to the amplitude and linearity control circuit 133. The output of the smoothing circuit 135 serves as an amplitude compensating signal, and the output of the smoothing circuit 131 serves as a linearity compensating signal. With these signals coupled to the amplitude and linearity control circuit, the amplitude and linearity of the deflection current can be automatically controlled.

Figure 22:
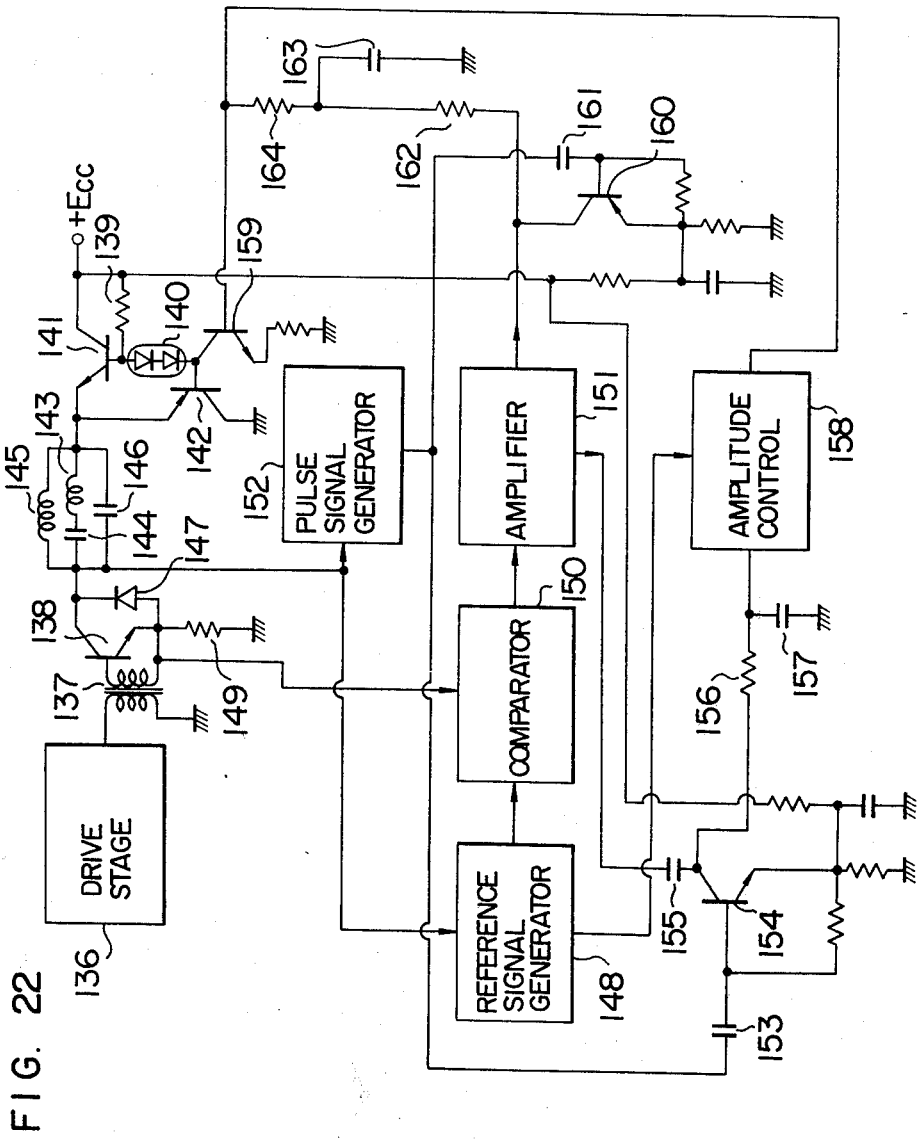
FIG. 22 is a schematic showing a specific circuit construction embodying the invention.

FIG. 22 shows a specific circuit construction of the horizontal deflection circuit embodying the invention. Here, a signal obtained from a drive stage 136 is coupled through a transformer 137 to the base of an output transistor 138. A resistor 139, diodes 140 and transistors 141 and 142 in complementary connection structure a controller connected to a +$E_{cc}$ supply terminal. Connected between the collector of the output transistor 138 and the controller is a series circuit consisting of a deflection coil 143 and a d-c blocking capacitor 144. This series circuit constitutes an output side resonant circuit with a parallel inductor 143 having an impedance which is great compared to the deflection coil 143 and also with a parallel resonance capacitor 146. Designated at 147 is a damping diode.

The output transistor 138 is furnished with d-c voltage from the +$E_{cc}$ supply terminal through the controller consisting of the transistors 141 and 142 in complementary connection and also through the inductor 145 for switching action to cause deflection current in the horizontal deflection coil 143.

In response to a pulse output appearing at the collector of the output transistor 138, as shown by A in FIG.

Figure 23:
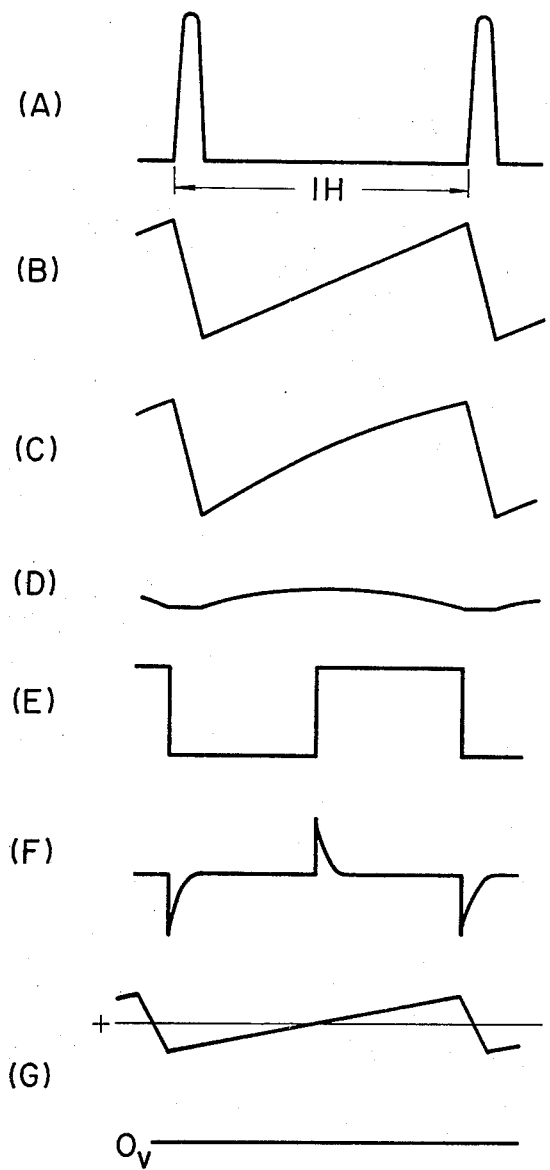
FIG. 23 is a wave-form chart showing wave-forms appearing at various parts of the circuit of FIG. 22.

23, a reference sawtooth wave signal generator 148 produces a reference sawtooth wave signal of very high linearity, as shown by B in FIG. 23, for comparing a detection signal obtained from a detection resistor 149, as shown at D in FIG. 23, in a comparator 150, whose output, i.e., comparison output signal, as shown by D in FIG. 23, is amplified by an amplifier 151. Also, in response to the pulse output from the collector of the output transistor 138 a circuit 152 produces a pulse signal switching substantially at the center of the horizontal scanning period, as shown by E in FIG. 23, which is coupled through a differentiating capacitor 153 to the base of a clamping transistor 154. Meanwhile, the amplified comparison output signal from the amplifier 151 is coupled through a coupling capacitor 155 to the collector of the clamping transistor 154. Thus, the input to the base of the clamping transistor 154 is clamped with a differential pulse signal, as shown by F in FIG. 23, substantially at the center of the horizontal scanning period, thus obtaining a clamped signal. If the linearity and amplitude of the current flowing in the deflection coil 143 are varied, the wave-form of the comparison output signal varies, so that the clamped output signal obtained from the transistor 154 also varies up and down from the clamping point. The clamped output signal is smoothed through a resistor 156 and a capacitor 157, and the resultant signal is coupled to a sawtooth wave signal amplitude controller 158 for controlling the amplitude of the reference sawtooth wave signal from the reference sawtooth wave signal generator 148 to a desired amplitude for coupling to the base of an amplifying transistor 159.

Meanwhile, the amplified comparison signal output from the amplifier 151 is coupled to a gate transistor 160 for gating the pulse signal coupled from the circuit 152 through a capacitor 161, which pulse signal switching substantially at the center of the horizontal scanning period as shown by E in FIG. 23.

The gated signal obtained by gating part of the comparison output signal for either first or second half of the horizontal scanning period is smoothed through a resistor 162 and a capacitor 163 and coupled through a resistor 164 to the transistor 159 to obtain an amplitude compensating signal. By superimposing the linearity compensating signal upon this amplitude compensating signal a control signal having a wave-form as shown by G in FIG. 23 is obtained. Also, a signal obtained by superimposing a desired linearity compensating signal obtained by differentiating the comparison output signal of the comparator 50 upon the above amplitude compensating signal may be used as a control signal as well. Further, it is possible to carry out the invention by superimposing the linearity control signal mentioned earlier in connection with the circuits of FIGS. 15 to 19 upon the above amplitude compensating signal.

As has been made apparent, according to the invention the deflection current may be automatically controlled by so arranging as to compare the linearity of the current actually flowing in the deflection coil with respect to a reference sawtooth wave in a comparator and clamping the resultant comparison output signal under the control of a particular pulse signal to produce a control signal for compensating the linearity of the deflection current wave. By so doing, it is possible to cause a deflection current having a desired linearity to flow in the deflection coil and automatically compensate for distortions due to ambient temperature changes, secular changes, fluctuations of circuit parts, fluctuations of the source voltage and so forth. Consequently, the compensation can be effected independent of the video signal.

Figure 24:
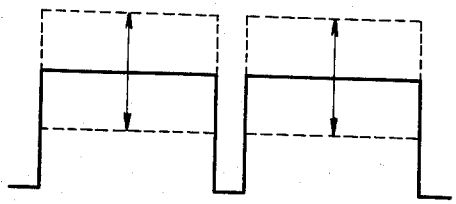
FIG. 24 shows the wave-form of an amplitude compensating control signal.

In the circuit of FIG. 22, the series circuit constituted by the deflection yoke and d-c blocking capacitor is connected in parallel with an inductor having an impedance which is great compared to that of the yoke and also with the damping capacitor, and this parallel circuit is connected in series with the output transistor and also with the controller. In the case where the control signal is coupled to one of two windings of a transformer and the other winding is connected in series with the deflection coil as in the constructions of FIGS. 13 and 14, a signal as shown in FIG. 24 may be used as an amplitude compensation control signal while using the same linearity control signal as described in connection with the circuit of FIG. 22. Although the amplitude control of the amplitude compensation control signal is not shown, the amplitude of the rectangular wave shown in FIG. 24 is controlled according to the detection signal for the amplitude compensation to the desired amplitude for coupling to the afore-mentioned transformer, thereby stabilizing the deflection coil current.

Figure 25:
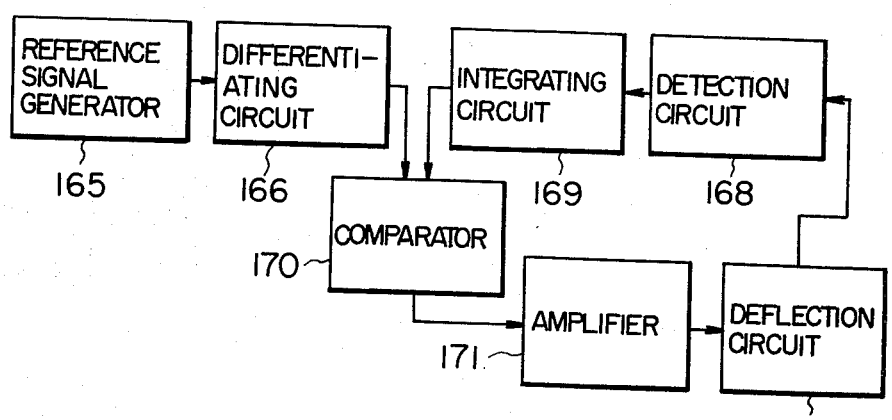
FIG. 25 is a block diagram of a further example of the wave-form compensating circuit.

FIG. 25 shows a still further embodiment of the invention. In this arrangement, a reference signal obtained from a reference sawtooth wave generator 165 is differentiated in a differentiating circuit 166, while in response to part of the current in a deflection circuit 167 including a deflection coil a detection circuit 168 produces a detection signal, which is integrated through an integrating circuit 169. The outputs of the circuits 166 and 169 are coupled to a comparator 170 to obtain a difference signal, which is coupled through an amplifier 171 to the deflection circuit 167 for causing deflection current therein.

Figure 26:
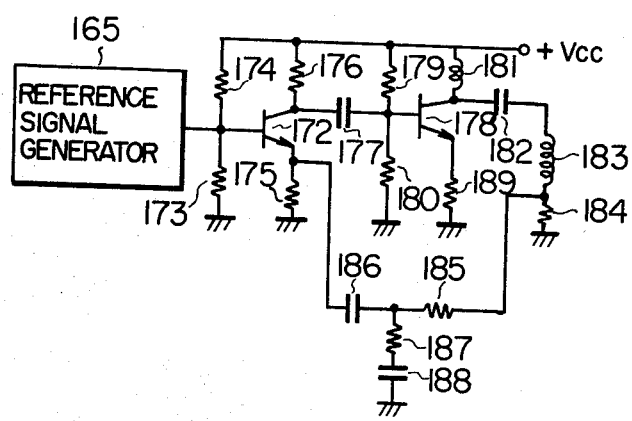
FIG. 26 is a circuit diagram of a circuit based on the construction of FIG. 25.

FIG. 26 shows a specific example of the circuit construction of the circuit of FIG. 25. Here, the reference signal from the reference sawtooth wave signal generator 165 is coupled to a comparing transistor 172 biased through bias resistors 173 and 174, and the signal appearing at the emitter is differentiated through a differentiating circuit consiting of a resistor 187 and a capacitor 188. Meanwhile, in response to the deflection current flowing in a deflection coil 183 a detection resistor 184 produces a detection signal, which is coupled through a resistor 185 to an integrating circuit constituted by the resistor 187 and capacitor 188, and the resultant signal is coupled through a coupling capacitor 186 of a very small impedance to the emitter of the comparing transistor 172, which has its emitter connected through a resistor 175 to ground and its collector connected through a resistor 176 to a $+V_{cc}$ supply terminal. The comparison output signal obtained through comparison of the two comparison inputs is coupled through a coupling capacitor 177 to an amplifying transistor 178 biased through bias resistors 179 and 180. The transistor 178 has its emitter connected through a resistor 189 to ground and its collector connected through an inductor 181 having an impedance very great compared to that of the deflection coil 183 to the $+V_{cc}$ supply terminal. The amplified signal from the transistor 178 is coupled through a coupling capacitor 182 to the deflection coil 183 for causing the deflection current therein and also in the detection resistor 184.

While, in a prior art circuit part of the deflection current flowing in the deflection coil is detected and fed back as a detection signal through a current-feedback amplifier, with this measure alone the deflection current wave-form is subject to distortion due to the inductance. In contrast, by effecting the compensating with a signal obtained through comparison of a signal obtained by differentiating the reference signal it is possible to pass a deflection current of very high linearity in the deflection coil.

What we claim is:

1. A deflection system for generating a deflection current that flows through a deflection coil, comprising:
   detection means, responsive to said deflection current, for generating a detection signal analogous to said deflection current;
   reference signal generating means for generating a reference signal synchronized to the deflection current;
   first circuit means, responsive to both of said detection signal and reference signal, for generating a controlled signal; and
   second circuit means for compensating said deflection current in response to said controlled signal.

2. A deflection system as set forth in claim 1, wherein said deflection current is produced by amplifying the successive reference signal; and also wherein said first circuit means comprises a first circuit for differentiating said reference signal, a second circuit for integrating said detection signal and a third circuit for mixing the outputs of said first and second circuits to produce a linearity controlled signal analogous to the deflection current; said second circuit means including an amplifier for amplifying the linearity controlled signal to produce the deflection current.

3. A deflection system as set forth in claim 2, wherein:
   said detection means comprises a resistor connected in series with said deflection coil; and also wherein:
   said third circuit is an amplifier having an input electrode, an output electrode and a common electrode, the reference signal being supplied to said input electrode, a load resistor and a common resistor being connected to said output and common electrodes, respectively;
   said first and second circuits constituting a feedback circuit one end of which is connected to said resistor connected in series with said deflection coil, the other end of which is connected to said common electrode, and which comprises a coupling capacitor, a feedback resistor and a series circuit of a resistor and a capacitor, said series circuit acting as a differentiating circuit for said reference signal and acting as an integrating circuit for said detection signal, whereby a linearity controlled signal is produced from said output electrode of said amplifier.

4. A deflection system for generating a deflection current by means of the switching action of a switching element connected in a series with a deflection coil, comprising:
   detection means, responsive to said deflection current, for generating a detection signal;
   reference signal generating means for generating a reference signal synchronized to said deflection current;
   comparison circuit means, responsive to said detection signal and said reference signal, for generating a comparison output signal;
   control signal generating means, responsive to said compared output signal, for generating a control signal; and
   control circuit means connected in series with said switching element and said deflection coil for controlling said deflection current in accordance with said control signal.

5. A deflection system as set forth in claim 4, wherein said control signal generating means comprises a differentiating circuit for differentiating said comparison output signal to generate the control signal.

6. A deflection system as set forth in claim 4, wherein the amplitude of said reference signal is in proportion to the amplitude of said deflection current, and also wherein the comparison output signal of said comparison circuit corresponds to an amplitude difference between said reference signal and detection signal, said amplitude difference representing a distortion of said deflection current from a desired wave-form of said deflection current.

7. A deflection system as set forth in claim 4, wherein said control circuit means comprises a transformer having a first winding connected in series with said deflection coil, said control signal from said control signal generating means being supplied to a second winding of said transformer.

8. A deflection system as set forth in claim 4, wherein said control circuit means comprises:
   a series connection of a d-c blocking capacitance element and said deflection coil;
   an inductive element offering high inductance compared to that of said deflection coil at a deflection frequency and being connected in parallel with said series connection;
   a voltage control element connected in series with said switching element and said series connection to control a d-c supply voltage on said switching element; and
   a circuit for supplying said control signal to said voltage control element for activation thereof.

9. A deflection system as set forth in claim 4, wherein said control signal generating means comprises a synchronous detection circuit for synchronously detecting the comparison output signal of said comparison circuit means with a reference signal for synchronous detection which is synchronized to said deflection current and whose duty ratio is about 1 : 1, and a smoothing circuit for smoothing the output of said synchronous detection circuit to generate said control signal.

10. A deflection system as set forth in claim 4, wherein said control signal generating means comprises:
   a synchronous detection circuit for synchronously detecting said comparison output signal with a reference signal for a synchronous detection which is synchronized to said deflection current and whose duty ratio is about 1 : 1;
   a smoothing circuit for smoothing the output of said synchronous detection circuit;
   a differentiating circuit for differentiating said comparison output signal; and
   an adder circuit for adding the outputs of said smoothing circuit and differentiating circuit to generate said control signal.

11. A deflection system for generating a sawtooth wave current that flows through a deflection coil by means of the switching action of a switching element connected in series with a deflection coil, comprising;
- detection means, responsive to the wave-form of said sawtooth wave current, for generating a first output signal;
- first circuit means for generating a reference sawtooth wave voltage synchronized to said sawtooth wave current;
- comparison circuit means, responsive to said first output signal and said reference sawtooth wave voltage, for generating a second output signal;
- second circuit means for generating a compensating signal synchronized to the sawtooth wave current;
- third circuit means, responsive to said second output signal of said comparison circuit means, for controlling the amplitude of said compensating signal to generate a control signal; and
- control circuit means for controlling said sawtooth wave current in response to said control signal.

12. A deflection system as set forth in claim 11, wherein said compensating signal is produced from said reference sawtooth wave voltage.

13. A deflection system as set forth in claim 11, wherein said third circuit means comprises a clamping circuit for clamping the second output signal of said comparison circuit at the center of the scanning period of the deflection, a smoothing circuit for smoothing the output of said clamping circuit, and an amplitude control circuit, responsive to the output of said smoothing circuit, for controlling the amplitude of said compensating signal to generate said control signal.

14. A deflection system as set forth in claim 11, wherein said third circuit means comprises a clamping circuit for clamping the second output signal of said comparison circuit in the blanking period of the deflection, a smoothing circuit for smoothing the output of said clamping circuit, and an amplitude control circuit, responsive to the output of said smoothing circuit, for controlling the amplitude of the compensating signal to generate said control signal.

15. A deflection system for generating a deflection current by means of the switching action of a switching element connected in series with a deflection coil, comprising;
- detection means, responsive to the wave-form of said deflection current for generating a first output signal;
- first circuit means for generating a reference voltage wave analogous to and synchronized to said deflection current;
- second circuit means, responsive to said first output signal and said reference voltage wave, for generating a second output signal;
- third circuit means for generating a compensating signal synchronized to said deflection current;
- fourth circuit means for controlling the amplitude of the compensating signal in response to said second output signal to generate a control signal; and
- control circuit means for controlling the amplitude of said deflection current in response to said control signal.

16. A deflection system as set forth in claim 15, wherein said fourth circuit means comprises:
- a synchronous detection circuit for synchronously detecting said second output siganl of said second circuit means with a reference signal which is synchronized to the deflection current and whose duty ratio is about 1 : 1; and
- a smoothing circuit for smoothing the output of said synchronous detection circuit to generate said control signal.

* * * * *